US008500950B2

(12) United States Patent
Sawai et al.

(10) Patent No.: US 8,500,950 B2
(45) Date of Patent: Aug. 6, 2013

(54) EXPOSURE CONDITION SETTING METHOD, SUBSTRATE PROCESSING APPARATUS, AND COMPUTER PROGRAM

(75) Inventors: Kazuo Sawai, Minato-ku (JP); Akihiro Sonoda, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 266 days.

(21) Appl. No.: 13/114,329

(22) Filed: May 24, 2011

(65) Prior Publication Data

US 2011/0220287 A1 Sep. 15, 2011

Related U.S. Application Data

(62) Division of application No. 11/718,760, filed as application No. PCT/JP2005/020450 on Nov. 8, 2005, now Pat. No. 7,960,078.

(30) Foreign Application Priority Data

Nov. 16, 2004 (JP) ................................ 2004-331745

(51) Int. Cl.
- H01L 21/306 (2006.01)
- H01L 21/3063 (2006.01)
- H01L 21/3065 (2006.01)
- H01L 21/308 (2006.01)

(52) U.S. Cl.
USPC .................... 156/345.24; 204/298.31; 216/59

(58) Field of Classification Search
None
See application file for complete search history.

(56) References Cited

U.S. PATENT DOCUMENTS

| 5,965,309 | A | 10/1999 | Ausschnitt et al. |
|---|---|---|---|
| 6,625,497 | B2 | 9/2003 | Fairbairn et al. |
| 6,625,512 | B1 | 9/2003 | Goodwin |
| 6,643,557 | B1 | 11/2003 | Miller et al. |
| 7,553,678 | B2 | 6/2009 | Zhou et al. |
| 2003/0048458 | A1 | 3/2003 | Mieher et al. |
| 2004/0147121 | A1 | 7/2004 | Nakagaki et al. |
| 2004/0190008 | A1 | 9/2004 | Mieher et al. |

FOREIGN PATENT DOCUMENTS

| JP | 2002 190446 | 7/2002 |
|---|---|---|
| JP | 2002 260994 | 9/2002 |
| JP | 2003 59990 | 2/2003 |

(Continued)

OTHER PUBLICATIONS

Robert Jones, et al., "Etch Simulations for Lithography Engineers", Proceedings of SPIE, vol. 4691, (Optical Microlithography XV), Mar. 5, 2002, p. 1232-1242.

*Primary Examiner* — Keath Chen
*Assistant Examiner* — Aiden Lee
(74) *Attorney, Agent, or Firm* — Oblon, Spivak, McClelland, Maier & Neustadt, L.L.P.

(57) ABSTRACT

A method includes forming a resist film on an etching target layer disposed on a test substrate, and performing sequential light exposure with a predetermined test pattern on the resist film sequentially at a plurality of areas, while respectively using different combinations of a light exposure amount and a focus value, along with subsequent development, thereby forming resist patterns at the plurality of areas; then etching the etching target layer, removing the resist patterns, and measuring shapes of etched patterns at the plurality of areas by means of a scatterometory technique; and determining a management span of combinations of a light exposure amount and a focus value admissible to obtain an etched pattern with a predetermined shape, with reference to the light exposure amounts and focus values used in the sequential light exposure, the line widths of the resist patterns, and the line widths of the etched patterns.

11 Claims, 8 Drawing Sheets

FOREIGN PATENT DOCUMENTS

| | | |
|---|---|---|
| JP | 2004 158478 | 6/2004 |
| JP | 2005 188944 | 7/2005 |
| WO | 01 97279 | 12/2001 |
| WO | 02 09170 | 1/2002 |
| WO | 03 007365 | 1/2003 |

EXPOSURE CONDITION SETTING METHOD, SUBSTRATE PROCESSING APPARATUS, AND COMPUTER PROGRAM

CROSS REFERENCE

This application is a division of and is based upon and claims the benefit of priority under 35 U.S.C. §120 for U.S. Ser. No. 11/718,760, filed May 7, 2007, the entire contents of which are incorporated herein by reference. U.S. Ser. No. 11/718,760 is a National Stage of PCT/JP05/20450, filed Nov. 8, 2005, and claims the benefit of priority under 35 U.S.C. §119 from Japanese Patent Application No. 2004-331745, filed Nov. 16, 2004.

TECHNICAL FIELD

The present invention relates to a light exposure condition setting method for setting optimum light exposure conditions for performing light exposure with a predetermined pattern on a resist film to be used as an etching mask, to form an etched pattern in a well controlled shape in the process of manufacturing semiconductor devices. The present invention further relates to a substrate processing apparatus and a computer program each used in performing the light exposure condition setting method.

BACKGROUND ART

In the process of manufacturing semiconductor devices having multi-layered interconnection structures, such as a damascene structure, the following steps are performed, for example. Specifically, a resist film is formed on an inter-level insulating film, and is then subjected to light exposure with a predetermined pattern and development. Thereafter, the resist pattern thus formed is used as an etching mask for performing plasma etching on the inter-level insulating film, thereby patterning the inter-level insulating film. Also in the process of fabricating a photo-mask, a resist pattern is formed on a light shielding layer disposed on a substrate, and dry etching is then performed thereon, thereby patterning the light shielding layer.

In order to control the line width and so forth of an etched pattern thus formed, the shapes of etched patterns are periodically observed by an SEM, as disclosed in Patent Document 1 set out below. Where the shape of an etched pattern is out of a predetermined dimension range, etching conditions and process conditions (the light exposure amount and focus value) in a photolithography step for forming a resist pattern to be used as an etching mask are adjusted by an operator, on the basis of past process data or the like, thereby correcting dimensions of etched patterns.

However, since SEM observation requires skill and entails individual differences in judging shapes, it takes a long time to determine light exposure conditions. Further, according to the dimension correcting method described above, dimensions of etched patterns are adjusted in accordance with the average dimensions in one wafer (or one lot), and thus planar fluctuations of dimensions on one wafer cannot be corrected.
[Patent Document 1]
  Jpn. Pat. Appln. KOKAI Publication No. 2003-59990

DISCLOSURE OF INVENTION

An object of the present invention is to provide a light exposure condition setting method that allows an etched pattern with a predetermined shape to be easily obtained.

Another object of the present invention is to provide a light exposure condition setting method that allows etched patterns with a predetermined shape all over the surface of a substrate.

Another object of the present invention is to provide a substrate processing apparatus and a computer program each used in performing the light exposure condition setting method.

According to a first aspect of the present invention, there is provided a light exposure condition setting method comprising: forming a resist film on an etching target layer disposed on a test substrate, and performing sequential light exposure with a predetermined test pattern on the resist film sequentially at a plurality of areas, while respectively using different combinations of a light exposure amount and a focus value, along with subsequent development, thereby forming resist patterns at the plurality of areas; measuring shapes of the resist patterns at the plurality of areas by means of a scatterometory technique; etching the etching target layer by use of the resist film with the resist patterns formed thereon as an etching mask, and removing the resist film from the substrate, thereby forming etched patterns at the plurality of areas; measuring shapes of the etched patterns at the plurality of areas by means of a scatterometory technique; and determining a management span of combinations of a light exposure amount and a focus value admissible to obtain an etched pattern with a predetermined shape, with reference to the combinations of a light exposure amount and a focus value used in the sequential light exposure for the plurality of areas, measurement results of the shapes of the resist patterns formed at the plurality of areas, and measurement results of the shapes of the etched patterns formed at the plurality of areas.

In the first aspect described above, the method may further comprise: determining one combination of a light exposure amount and a focus value within the management span after determining the management span; forming a resist film on an etching target layer disposed on a product substrate, and performing light exposure with a predetermined product pattern on the resist film, while using the combination of a light exposure amount and a focus value thus determined, along with subsequent development; and etching the etching target layer and removing the resist film, thereby forming an etched pattern; measuring a shape of the etched pattern by means of a scatterometory technique; judging whether or not the shape of the etched pattern is within a predetermined admissible dimension range; and, if the shape of the etched pattern is out of the admissible dimension range, determining a new combination of a light exposure amount and a focus value within the management span such that a shape of an etched pattern to be formed on another product substrate subsequently processed is brought into the admissible dimension range.

In the first aspect described above, the method may further comprise: determining one combination of a light exposure amount and a focus value within the management span after determining the management span; forming a resist film on an etching target layer disposed on a product substrate, and performing light exposure with a predetermined product pattern on the resist film, while using the combination of a light exposure amount and a focus value thus determined, along with subsequent development; and etching the etching target layer and removing the resist film, thereby forming an etched pattern; measuring a shape of the etched pattern by means of a scatterometory technique; judging whether or not the shape of the etched pattern is within a predetermined admissible dimension range; if the shape of the etched pattern formed on the product substrate is out of the predetermined admissible dimension range, and a new combination of a light exposure amount and a focus value, determined such that a shape of an etched pattern to be formed on another product substrate subsequently processed is brought into the admissible dimension range, is out of the management span, performing light exposure with the product pattern on said another product substrate, while using the new combination of a light exposure amount and a focus value thus determined, along with subsequent development; and measuring a shape of a resist pattern thereby obtained; if the shape of the resist pattern is within a predetermined dimension range, determining a new management span of combinations of a light exposure amount and a focus value, with reference to a target dimension of the test pattern, the shapes of the resist patterns formed on the test substrate, and the combinations of a light exposure amount and a focus value used in the sequential light exposure; and, if the shape of the resist pattern is out of a predetermined dimension range, re-executing a series of processes to determine a new management span of combinations of a light exposure amount and a focus value, while using a new test substrate.

In this case, in order to determine the new management span, while using the new test substrate, the method preferably further comprises, prior to processing the new test substrate, checking apparatuses used for a series of processes from resist film formation through an etching process to resist film removal.

In the first aspect described above, the plurality of areas preferably form a matrix with a light exposure amount and a focus value used as parameters, and a measurement target of a pattern preferably includes a line width of the pattern.

According to a second aspect of the present invention, there is provided a substrate processing apparatus comprising: a light exposure processing section configured to perform light exposure with a predetermined pattern on a resist film formed on an etching target layer disposed on a substrate; a pattern shape measuring section configured to measure a shape of a resist pattern and a shape of an etched pattern by means of a scatterometory technique; and a control section configured to control the light exposure processing section and the pattern shape measuring section, wherein the control section makes reference to: a result of performing sequential light exposure with a predetermined test pattern on a resist film formed on a substrate, sequentially at a plurality of areas, while respectively using different combinations of a light exposure amount and a focus value, along with subsequent development, thereby forming resist patterns at the plurality of areas, and then measuring shapes of the resist patterns at the plurality of areas by the pattern shape measuring section; a result of etching the etching target layer by use of the resist film with the resist patterns formed thereon as an etching mask, thereby forming etched patterns at the plurality of areas, and then measuring shapes of the etched patterns at the plurality of areas by the pattern shape measuring section; and the combinations of a light exposure amount and a focus value used in the sequential light exposure for the plurality of areas, so as to determine a management span of combinations of a light exposure amount and a focus value admissible to obtain a predetermined etched pattern.

In the second aspect described above, the apparatus may have an arrangement in which, if a shape of an etched pattern formed on a product substrate by performing light exposure thereon, while using one combination of a light exposure amount and a focus value determined within the management span, is out of the admissible dimension range, the control section determines a new combination of a light exposure amount and a focus value within the management span such that a shape of an etched pattern to be formed on another product substrate subsequently processed is brought into the admissible dimension range.

In the second aspect described above, the apparatus may have an arrangement in which, if a shape of an etched pattern formed on a product substrate by performing light exposure thereon, while using one combination of a light exposure amount and a focus value determined within the management span, is out of the admissible dimension range, and a new combination of a light exposure amount and a focus value, determined such that a shape of an etched pattern to be formed on another product substrate subsequently processed is brought into the admissible dimension range, is out of the management span, the control section controls the light exposure processing section to perform light exposure on said another product substrate, while using the new combination of a light exposure amount and a focus value thus determined, and, if a shape of a resist pattern formed on said another product substrate by performing light exposure thereon, while using the new combination of a light exposure amount and a focus value, is within a predetermined dimension range, the control section determines a new management span of combinations of a light exposure amount and a focus value, with reference to the shapes of the resist patterns formed on the substrate by the sequential light exposure, a target dimension of a photo mask used for forming the resist patters, and the combinations of a light exposure amount and a focus value used in the sequential light exposure.

In the second aspect described above, the pattern shape measuring section may include a first measuring section configured to measure a shape of a resist pattern and a second measuring section configured to measure a shape of an etched pattern.

According to a third aspect of the present invention, there is provided a computer program including software for execution on a computer, used for a substrate processing apparatus, which comprises a light exposure processing section configured to perform light exposure with a predetermined pattern on a resist film formed on a substrate, and a pattern shape measuring section configured to measure a shape of a resist pattern and a shape of an etched pattern by means of a scatterometory technique, wherein the software, when executed by the computer, controls the apparatus to perform a method comprising: forming a resist film on an etching target layer disposed on a test substrate, and performing sequential light exposure with a predetermined test pattern on the resist film sequentially at a plurality of areas, while respectively using different combinations of a light exposure amount and a focus value, along with subsequent development, thereby forming resist patterns at the plurality of areas; measuring shapes of the resist patterns at the plurality of areas by means of a scatterometory technique; etching the etching target layer by use of the resist film with the resist patterns formed thereon as an etching mask, and removing the resist film from the substrate, thereby forming etched patterns at the plurality of areas; measuring shapes of the etched patterns at the plurality of areas by means of a scatterometory technique; and determining a management span of combinations of a light exposure amount and a focus value admissible to obtain an etched pattern with a predetermined shape, with reference to the combinations of a light exposure amount and a focus value used in the sequential light exposure for the plurality of areas, measurement results of the shapes of the resist patterns formed at the plurality of areas, and measurement results of the shapes of the etched patterns formed at the plurality of areas.

In the third aspect described above, the method may further comprise: determining one combination of a light exposure amount and a focus value within the management span after determining the management span; forming a resist film on an etching target layer disposed on a product substrate, and performing light exposure with a predetermined product pattern on the resist film, while using the combination of a light exposure amount and a focus value thus determined, along with subsequent development; and etching the etching target layer and removing the resist film, thereby forming an etched pattern; measuring a shape of the etched pattern by means of a scatterometory technique; judging whether or not the shape of the etched pattern is within a predetermined admissible dimension range; and, if the shape of the etched pattern is out of the admissible dimension range, determining a new combination of a light exposure amount and a focus value within the management span such that a shape of an etched pattern to be formed on another product substrate subsequently processed is brought into the admissible dimension range.

In the third aspect described above, the method may further comprise: determining one combination of a light exposure amount and a focus value within the management span after determining the management span; forming a resist film on an etching target layer disposed on a product substrate, and performing light exposure with a predetermined product pattern on the resist film, while using the combination of a light exposure amount and a focus value thus determined, along with subsequent development; and etching the etching target layer and removing the resist film, thereby forming an etched pattern; measuring a shape of the etched pattern by means of a scatterometory technique; judging whether or not the shape of the etched pattern is within a predetermined admissible dimension range; if the shape of the etched pattern formed on the product substrate is out of the predetermined admissible dimension range, and a new combination of a light exposure amount and a focus value, determined such that a shape of an etched pattern to be formed on another product substrate subsequently processed is brought into the admissible dimension range, is out of the management span, performing light exposure with the product pattern on said another product substrate, while using the new combination of a light exposure amount and a focus value thus determined, along with subsequent development; and measuring a shape of a resist pattern thereby obtained; if the shape of the resist pattern is within a predetermined dimension range, determining a new management span of combinations of a light exposure amount and a focus value, with reference to a target dimension of the test pattern, the shapes of the resist patterns formed on the test substrate, and the combinations of a light exposure amount and a focus value used in the sequential light exposure; and, if the shape of the resist pattern is out of a predetermined dimension range, re-executing a series of processes to determine a new management span of combinations of a light exposure amount and a focus value, while using a new test substrate.

According to a fourth aspect of the present invention, there is provided a light exposure condition setting method comprising: forming a resist film on an etching target layer disposed on a test substrate, and performing sequential light exposure with a predetermined test pattern on the resist film sequentially at a plurality of areas, while respectively using different combinations of a light exposure amount and a focus value, along with subsequent development, thereby forming resist patterns at the plurality of areas; measuring shapes of the resist patterns at the plurality of areas by means of a scatterometory technique; forming a resist film on an etching target layer disposed on a product substrate, and performing light exposure with a predetermined product pattern on the resist film, while using a predetermined combination of a light exposure amount and a focus value, along with subsequent development, etching, and resist film removal, thereby forming an etched patterns; and measuring shapes of the etched patterns by means of a scatterometory technique; and, if the etched patterns include an etched pattern at an area with a shape out of an admissible dimension range, changing the combination of a light exposure amount and a focus value used for performing light exposure on a product substrate, such that shapes of all etched patterns are brought into the admissible dimension range, with reference to the combinations of a light exposure amount and a focus value used in the sequential light exposure for the plurality of areas on the test substrate and measurement data of the shapes of the resist patterns formed on the test substrate.

In the fourth aspect described above, the method may be arranged such that a new combination of a light exposure amount and a focus value is applied to an area with a shape of an etched pattern out of the admissible dimension range, and a preceding combination of a light exposure amount and a focus value is applied to an area with a shape of an etched pattern within the admissible dimension range.

According to a fifth aspect of the present invention, there is provided a substrate processing apparatus comprising: a light exposure processing section configured to perform light exposure with a predetermined pattern on a resist film formed on an etching target layer disposed on a substrate; a pattern shape measuring section configured to measure a shape of a resist pattern and a shape of an etched pattern by means of a scatterometory technique; and a control section configured to control the light exposure processing section and the pattern shape measuring section, wherein the control section makes reference to: a result of performing sequential light exposure with a predetermined test pattern on a resist film formed on a test substrate, sequentially at a plurality of areas, while respectively using different combinations of a light exposure amount and a focus value, along with subsequent development, thereby forming resist patterns at the plurality of areas, and then measuring shapes of the resist patterns at the plurality of areas by the pattern shape measuring section; the combinations of a light exposure amount and a focus value used in the sequential light exposure for the plurality of areas; and a result of performing light exposure with a predetermined product pattern on a resist film formed on an etching target layer disposed on a product substrate, while using a predetermined combination of a light exposure amount and a focus value, along with subsequent development, etching, and resist film removal, thereby forming an etched patterns; and measuring shapes of the etched patterns by the pattern shape measuring section, if the etched patterns include an etched pattern at an area with a shape out of an admissible dimension range, and when the control section changes the combination of a light exposure amount and a focus value used for performing light exposure on a product substrate, such that shapes of all etched patterns are brought into the admissible dimension range.

In the fifth aspect described above, the control section may be arranged such that a new combination of a light exposure amount and a focus value is applied to an area with a shape of an etched pattern out of the admissible dimension range, and a preceding combination of a light exposure amount and a focus value is applied to an area with a shape of an etched pattern within the admissible dimension range.

According to a sixth aspect of the present invention, there is provided a computer program including software for execution on a computer, used for a substrate processing apparatus, which comprises a light exposure processing section configured to perform light exposure with a predetermined pattern on a resist film formed on a substrate, and a pattern shape measuring section configured to measure a shape of a resist pattern and a shape of an etched pattern by means of a scatterometory technique, wherein the software, when executed by the computer, controls the apparatus to perform a method comprising: forming a resist film on an etching target layer disposed on a test substrate, and performing sequential light exposure with a predetermined test pattern on the resist film sequentially at a plurality of areas, while respectively using different combinations of a light exposure amount and a focus value, along with subsequent development, thereby forming resist patterns at the plurality of areas; measuring shapes of the resist patterns at the plurality of areas by means of a scatterometory technique; forming a resist film on an etching target layer disposed on a product substrate, and performing light exposure with a predetermined product pattern on the resist film, while using a predetermined combination of a light exposure amount and a focus value, along with subsequent development, etching, and resist film removal, thereby forming an etched patterns; and measuring shapes of the etched patterns by means of a scatterometory technique; and, if the etched patterns include an etched pattern at an area with a shape out of an admissible dimension range, changing the combination of a light exposure amount and a focus value used for performing light exposure on a product substrate, such that shapes of all etched patterns are brought into the admissible dimension range, with reference to the combinations of a light exposure amount and a focus value used in the sequential light exposure for the plurality of areas on the test substrate and measurement data of the shapes of the resist patterns formed on the test substrate.

In the sixth aspect described above, the computer program may be arranged such that a new combination of a light exposure amount and a focus value is applied to an area with a shape of an etched pattern out of the admissible dimension range, and a preceding combination of a light exposure amount and a focus value is applied to an area with a shape of an etched pattern within the admissible dimension range.

According to the present invention, a resist film formed on an etching target layer disposed on a test substrate is subjected to sequential light exposure using different combinations of a light exposure amount and a focus value respectively at a plurality of areas, along with subsequent development, and the shapes of resist patterns thereby formed are measured by means of a scatterometory technique. Then, the etching target layer is etched at the plurality of areas, and the shapes of etched patterns thereby formed are measured by means of a scatterometory technique. Then, a management span of combinations of a light exposure amount and a focus value admissible to obtain an etched pattern with a predetermined shape is determined with reference to the data described above. Consequently, it is possible to easily obtain an etched pattern within an admissible dimension range, thereby suppressing generation of defective products in the etching process.

Further, according to the present invention, a resist film formed on an etching target layer disposed on a test substrate is subjected to sequential light exposure using different combinations of a light exposure amount and a focus value respectively at a plurality of areas, along with subsequent development, and the shapes of resist patterns thereby formed are measured by means of a scatterometory technique. Then, a resist film formed on an etching target layer disposed on a product substrate is subjected to patterning with a predetermined product pattern, and the shapes of etched patterns thereby formed are measured by means of a scatterometory technique. Then, the combination of a light exposure amount and a focus value used for performing light exposure on a product substrate is changed with reference to the data described above, such that the shapes of all etched patterns are brought into an admissible dimension range. Consequently, it is possible to suppress planar fluctuations in the shapes of etched patterns on a substrate, and easily obtain etched patterns within the admissible dimension range all over the substrate, thereby suppressing generation of defective products.

BEST MODE FOR CARRYING OUT THE INVENTION

An embodiment of the present invention will now be described with reference to the accompanying drawings. The following explanation will be exemplified by a wafer processing system in which an etching target film (etching target layer) formed on a semiconductor wafer W is etched by use of a resist pattern to form an etched pattern.

Figure 1:
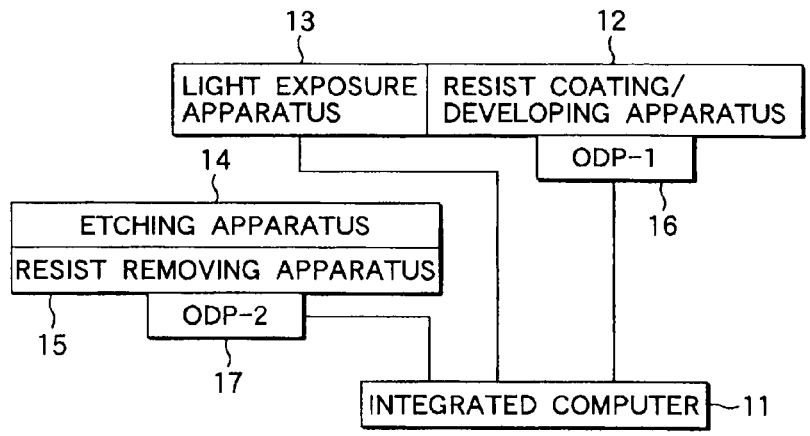
FIG. 1 This is a view showing the arrangement of a wafer processing system.

FIG. 1 is a view showing the arrangement of a wafer processing system for patterning an etching target film. This wafer processing system includes a resist coating/developing apparatus 12, a light exposure apparatus 13, an etching apparatus 14, a resist removing apparatus 15, a first line width measuring unit (ODP-1) 16 for measuring the shape of a resist pattern, a second line width measuring unit (ODP-2) 17 for measuring the shape of an etched pattern, and an integrated computer 11.

The resist coating/developing apparatus 12 is arranged to form a resist film on an etching target film, such as an inter-level insulating film, and to develop the resist film treated by a light exposure process. The etching target film has been formed by a CVD method or SOD (spin on dielectric) method in a film formation apparatus (not shown).

The light exposure apparatus 13 is arranged to perform light exposure on a resist film by use of a predetermined mask pattern (photo-mask) under predetermined light exposure conditions.

The etching apparatus 14 is arranged to etch an etching target film by use of a resist pattern as an etching mask. The etching apparatus 14 is formed of, e.g., a plasma etching apparatus.

The resist removing apparatus 15 is arranged to remove a resist pattern from a wafer W treated by an etching process. The resist removing apparatus 15 is formed of, e.g., a plasma ashing apparatus.

The first line width measuring unit (ODP-1) 16 is arranged to utilize scatterometory technique to measure the shape of a resist pattern formed by a development process in the resist coating/developing apparatus 12.

The second line width measuring unit (ODP-2) 17 is arranged to utilize a scatterometory technique to measure the shape of an etched pattern of an etching target film formed by an etching process in the etching apparatus 14. The second line width measuring unit (ODP-2) 17 has the same structure as the first line width measuring unit (ODP-1) 16, and differs therefrom only in the measurement target.

The scatterometory technique is disclosed in, e.g., Jpn. Pat. Appln. KOKAI Publication No. 2002-260994, and is arranged, as follows. Specifically, a diffraction light intensity distribution concerning a plurality of pattern shapes is calculated to fabricate, e.g., a library in advance. Then, light is radiated onto a measurement target pattern, and the angular direction distribution of diffraction light intensity is detected. Then, the detection result is compared with the library described above, thereby estimating the width, height, and so forth of the measurement target pattern by means of pattern matching.

In this embodiment, the integrated computer 11 is arranged to control the first and second line width measuring units 16 and 17 and light exposure apparatus 13. The integrated computer 11 may be arranged to control the resist coating/developing apparatus 12, etching apparatus 14, and resist removing apparatus 15 in addition to the units 16 and 17 and apparatus 13, and may be arranged to further control a film formation apparatus (not shown).

Figure 2:
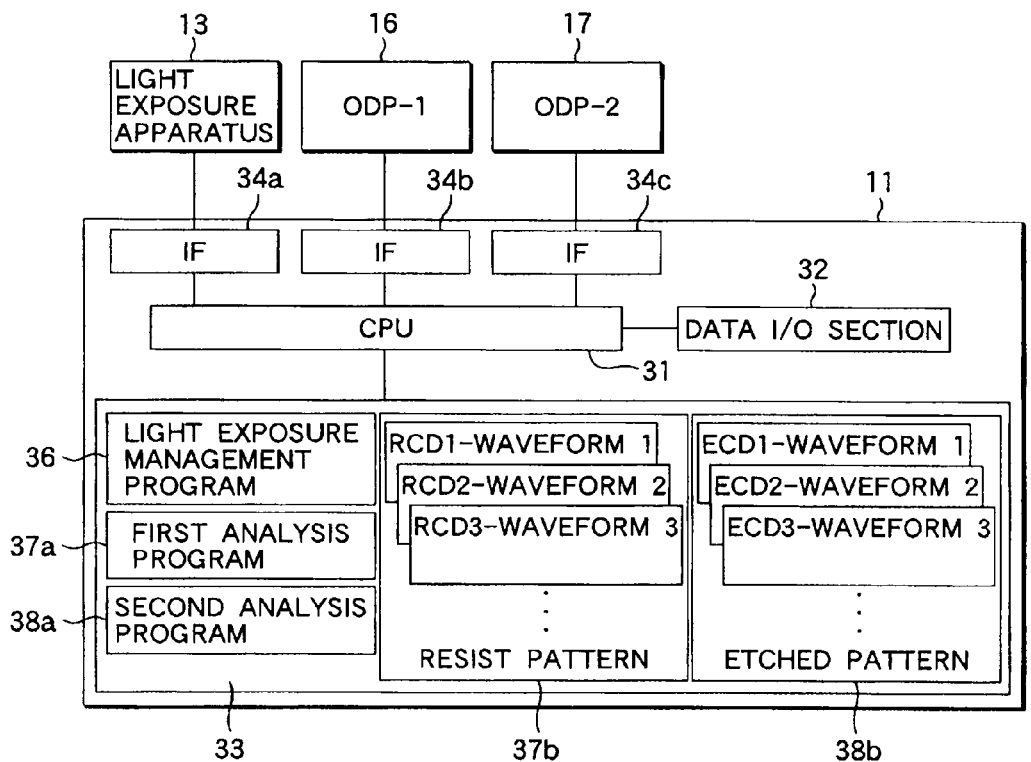
FIG. 2 This is a view schematically showing the arrangement of an integrated computer.

FIG. 2 is a view schematically showing the arrangement of the integrated computer 11. The integrated computer 11 includes a process controller (CPU) 31, a data I/O (input/output) section 32, and a storage section 33 that stores various kinds of data and programs. The data I/O section 32 includes, e.g., a keyboard and a display, wherein the keyboard is used for a process operator to input commands for determining a management span for a light exposure process, as described later, and the display is used for showing visualized images of calculation results obtained by the process controller (CPU) 31. The integrated computer 11 further includes interfaces (IF) 34a, 34b, and 34c that allow data communication to and from the first line width measuring unit (ODP-1) 16, second line width measuring unit (DOP-2) 17, and light exposure apparatus 13, respectively.

More specifically, the storage section 33 stores a light exposure management program 36, a first analysis program 37a, a first library (data base) 37b, a second analysis program 38a, and a second library (data base) 38b. The light exposure management program 36 is used for the process controller (CPU) 31 to determine a light exposure management span and to change combinations of a light exposure amount and a focus value, as described later. The first analysis program 37a is used for analyzing spectro-reflectometry spectra measured by the first line width measuring unit (ODP-1) 16, while the first library (data base) 37b is used for this analysis. The second analysis program 38a is used for analyzing spectro-reflectometry spectra measured by the second line width measuring unit (ODP-2) 17, while the second library (data base) 38b is used for this analysis.

The first library 37b contains units of data concerning parameters showing the shape of each resist pattern, such as the line width (e.g., "$_R CD_1$" shown in FIG. 2), bottom width, film thickness, and side surface angle, as well as spectro-reflectometry spectra corresponding to these parameters. Similarly, the second library 38b contains units of data concerning the shape of each etched pattern, such as the line width (e.g., "$_E CD_1$" shown in FIG. 2) and film thickness, as well as spectro-reflectometry spectra corresponding to them. It should be noted that "line width" denotes the width of the top surface of a pattern, and "bottom width" denotes the width of the bottom of the pattern.

The wafer processing system shown in FIGS. 1 and 2 have two line width measuring units, but may have only one line width measuring unit, which is used for measuring both of the shapes of the resist pattern and etched pattern. In the latter case, the integrated computer 11 may need to know whether a measurement target is the resist pattern or etched pattern. For example, it may be arranged such that, after the type of a measurement target is input by an operator into the integrated computer 11 through the data I/O section 32, the line width measuring unit starts measurement. Alternatively, the integrated computer 11 may store the transfer history of wafers so that the integrated computer 11 can automatically know the state of a wafer, such that it has been processed in the resist coating/developing apparatus 12 or it has been processed in the resist removing apparatus 15.

Next, an explanation will be given of a method for conditioning the wafer processing system to form an etched pattern with a predetermined shape in the wafer processing system, with reference to the flowchart shown in FIG. 3. This method for conditioning the wafer processing system is virtually a method for adjusting the exposure amount and focus value of the light exposure apparatus 13.

Figure 4:
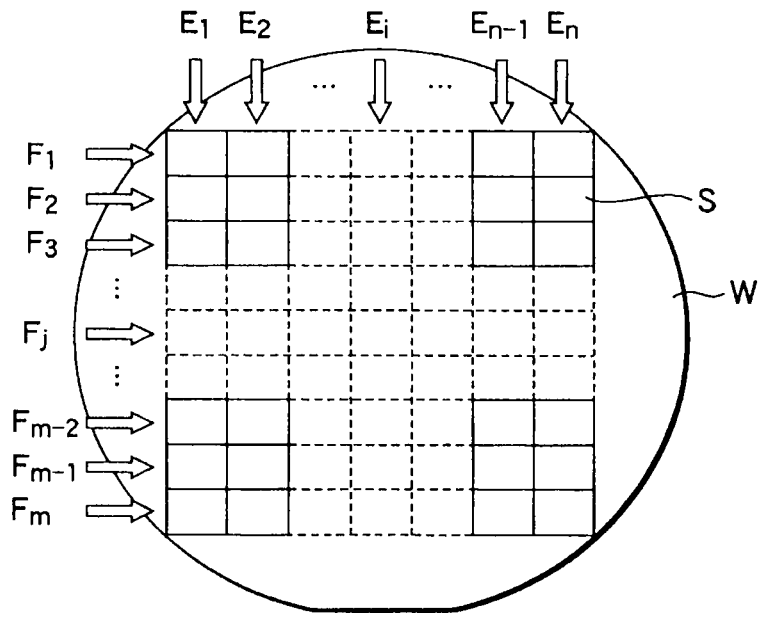
FIG. 4 This is a view showing a matrix used for sequential light exposure.

At first, an etching target film, such as a low-k film, is formed on a wafer W to prepare a test wafer W in a film formation apparatus (not shown) (Step 1). Then, the wafer W is transferred into the resist coating/developing apparatus 12, in which a resist film is formed on the etching target film (Step 2). The wafer W with a resist film formed thereon is transferred into the light exposure apparatus 13, in which the following light exposure process is performed (Step 3). Specifically, as shown in FIG. 4, a matrix is formed while the light exposure amount is sequentially changed at regular intervals within a range of from $E_0$ to $E_n$ (n is natural number), and the focus value is sequentially changed at regular intervals within a range of from $F_0$ to $F_m$ (m is natural number). Then, the light exposure process is performed such that each of the matrix elements $(E_i, F_j)$ is processed by one shot, (which will be referred to as "reference light exposure", hereinafter). This Step 3 is performed by use of a photo-mask that provides a resist pattern with a line width H0 (which will be referred to as "test pattern") where the light exposure amount and focus value are appropriate. Further, the target value of the line width of an etched pattern to be formed is also set at H0.

Then, the wafer W processed by the reference light exposure is returned into the resist coating/developing apparatus 12, in which a development process is performed (Step 4). Consequently, predetermined resist patterns are formed.

The wafer W with the resist patterns formed thereon is transferred into the first line width measuring unit (ODP-1) 16, in which the pattern shapes of the resist patterns are measured by means of a scatterometory technique (Step 5). In this Step 5, for every light exposure shot, i.e., for every matrix element ($E_i, F_j$), light having a predetermined wavelength is radiated onto, e.g., the center of the matrix element, and spectro-reflectometry spectra obtained at this time are measured.

Then, in the integrated computer 11, waveforms measured by the process of Step 5 are checked with reference to data concerning resist patterns recorded in the first library 37b to obtain the line widths of the resist patterns. Further, this result is matched and linked with the combinations of a light exposure amount and a focus value used in Step 3 (Step 6). Where a scatterometory technique is used for the shape of a resist pattern, not only the line width, but also the bottom width and side surface inclination can be obtained. However, the line width is used for representing the shape of a resist pattern, hereinafter.

Figure 5:
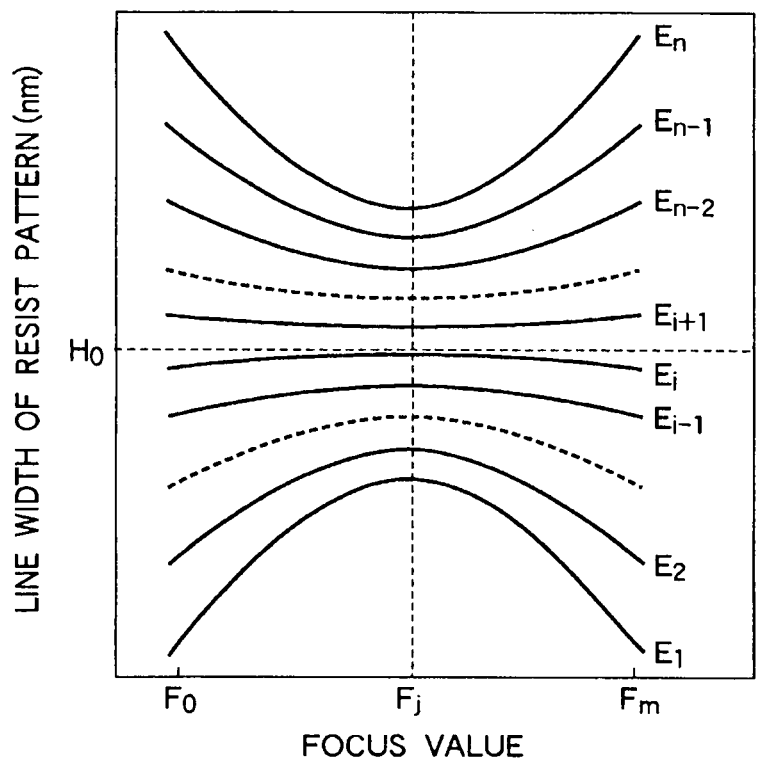
FIG. 5 This is a graph showing the relationship of the line widths of resist patterns obtained by sequential light exposure, relative to the light exposure amount and focus value.

FIG. 5 is a graph showing an example of the relationship of the line widths of the resist patterns obtained by Step 6, relative to the light exposure amount and focus value. This graph can be used as a material to confirm the degree of misalignment generated between the line width of a resist pattern and the line width of an etched pattern to be formed. Further, this graph can be used as a reference data when the combination of a light exposure amount and a focus value needs to be changed to obtain an etched pattern with a predetermined shape, in the course of processing product wafers W over time after a management span has been determined, as described later.

Then, the wafer W is transferred from the first line width measuring unit (ODP-1) 16 into the etching apparatus 14, in which the etching target film is etched by use of the resist patterns as an etching mask (Step 7). For example, the etching conditions of a plasma etching process can be changed by adjusting the vacuum level inside a chamber that accommodates a wafer W, the flow rate of a gas supplied into the chamber, the voltage for plasma generation, the process time. However, since such adjustment is not easy, the etching conditions are fixed at conditions for manufacturing products, in general. Accordingly, Step 7 is performed under such fixed conditions.

The wafer W treated by the etching process is transferred into the resist removing apparatus 15, in which a resist removing process is performed (Step 8). Consequently, etched patterns appear on the surface of the wafer W. Then, the wafer W is transferred into the second line width measuring unit (ODP-2) 17, in which the shapes of the etched patterns are measured by means of a scatterometory technique (Step 9). In the Step 9, for every light exposure shot, light is radiated onto the center of the matrix element, and spectro-reflectometry spectra obtained at this time are measured, as in Step 5 descried above.

Then, in the integrated computer 11, waveforms measured by the process of Step 9 are checked with reference to data concerning etched patterns recorded in the second library 38b to obtain the line widths of the etched patterns. Further, this result is linked with the combinations of a light exposure amount and a focus value respectively used for the matrix elements ($E_i, F_j$) (Step 10).

Figure 6:
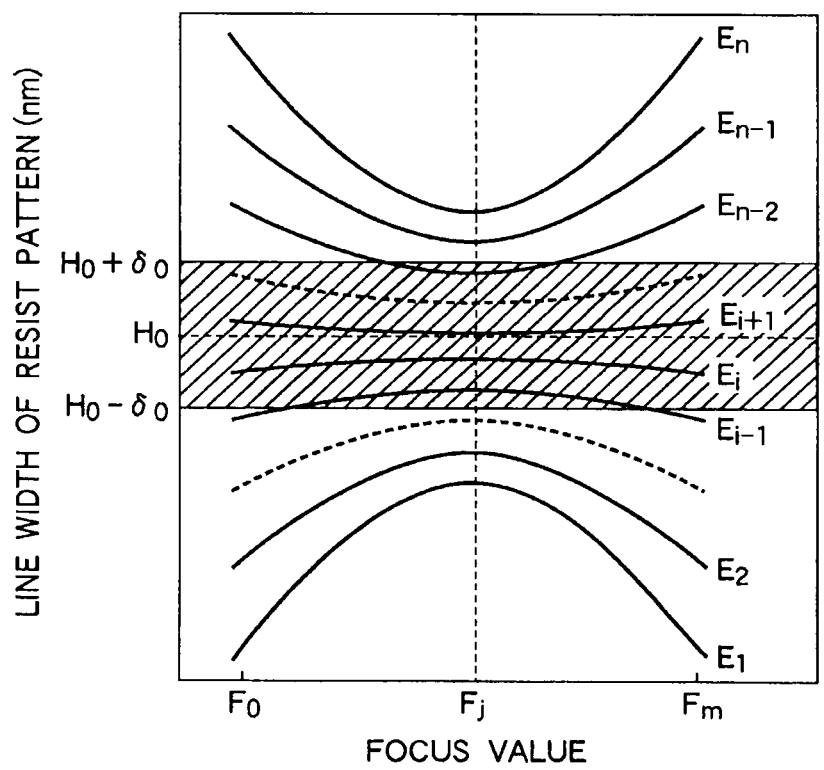
FIG. 6 This is a graph showing the relationship of the line widths of etched patterns, relative to the light exposure amount and focus value.

FIG. 6 is a graph showing an example of the relationship of the line widths of the etched patterns obtained by Step 10, relative to the light exposure parameters (i.e., the light exposure amount and focus value). As can be seen by comparison between FIGS. 5 and 6, a line representing a light exposure amount $E_i$ is closest to the line width H0 in FIG. 5, while a line representing a light exposure amount $E_{i+1}$ is closest to the line width H0 in FIG. 6. Accordingly, a combination of a light exposure amount and a focus value optimum to forming a resist pattern with high accuracy in shape is different from a combination of a light exposure amount and a focus value optimum to forming an etched pattern with high accuracy in shape.

The reason of this difference being generated will be briefly explained with reference to FIGS. 7A to 7D. FIGS. 7A to 7D are views showing an example of the relationship between the cross-sectional shape of a resist pattern and the cross-sectional shape of an etched pattern.

Figure 7A:
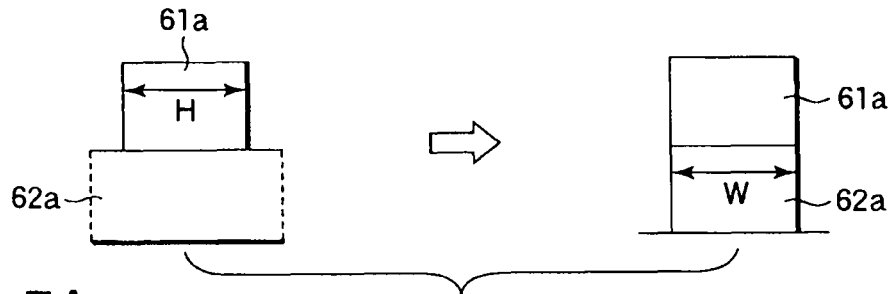
FIG. 7A This is a view showing an example of the relationship between the cross-sectional shape of a resist pattern and the cross-sectional shape of an etched pattern.
Figure 7B:
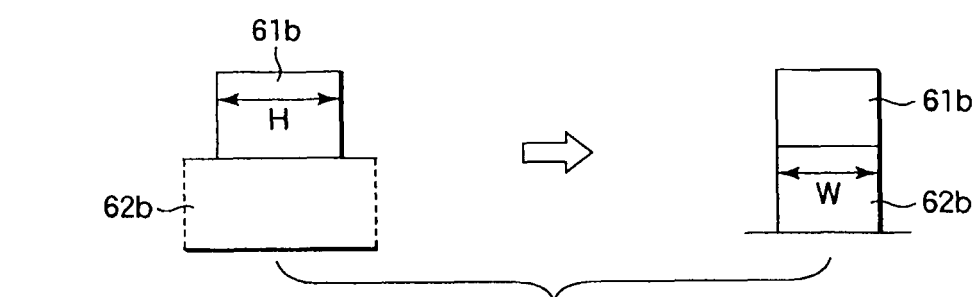
FIG. 7B This is a view showing an example of the relationship between the cross-sectional shape of a resist pattern and the cross-sectional shape of an etched pattern.
Figure 7C:
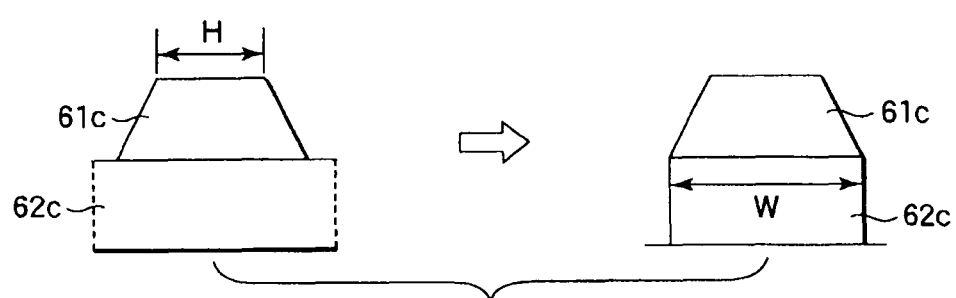
FIG. 7C This is a view showing an example of the relationship between the cross-sectional shape of a resist pattern and the cross-sectional shape of an etched pattern.
Figure 7D:
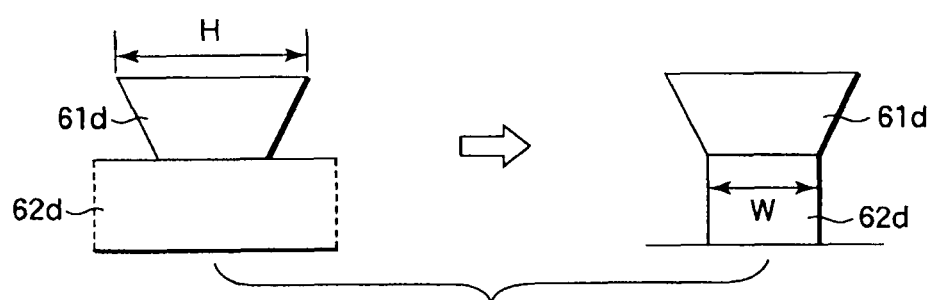
FIG. 7D This is a view showing an example of the relationship between the cross-sectional shape of a resist pattern and the cross-sectional shape of an etched pattern.

As shown in FIG. 7A, where a resist pattern 61a is rectangular and has good resistance to an etching atmosphere, an etched pattern 62a is formed to have a line width W equal to the line width H of the resist pattern 61a. On the other hand, as shown in FIG. 7B, where a resist pattern 61b is rectangular and has poor resistance to an etching atmosphere, an etched pattern 62b is formed to have a line width W smaller than the original line width H of the resist pattern 61b, because the resist pattern 61b is eroded during the etching process. Further, as shown in FIG. 7C, where a resist pattern 61c is trapezoidal, an etched pattern 62c is formed to have a line width W larger than the line width H of the resist pattern 61c. In reverse, as shown in FIG. 7D, where a resist pattern 61d is inverted-trapezoidal, an etched pattern 62d is formed to have a line width W smaller than the line width H of the resist pattern 61d.

As described above, the line width of an etched pattern is greatly influenced by the shape of a resist pattern. Further, it is difficult to obtain a good etched pattern without suitably performing light exposure on a resist film. Accordingly, it is beneficial to measure the shapes of resist patterns and link it with light exposure parameters to fabricate data thereon, as in Steps 5 and 6, in order to bring the line widths of etched patterns into an admissible dimension range, as well.

After data concerning the line widths of etched patterns is obtained in Step 10, a span of combinations of a light exposure amount and a focus value necessary for obtaining an etched pattern with a predetermined shape (which will be referred to as "management span", hereinafter) is determined in the integrated computer 11 (Step 11).

This Step 11 is performed, as follows.

At first, since a target line width of an etched pattern has a certain admissible margin, this margin can be defined as δ0. According to this definition, it is admissible if the line width of the etched pattern is within a range of H0±δ0. This admissible range of the etched pattern is shown in FIG. 6 as a shaded region. This region corresponds to the management span.

A management span is thus formed on combinations of a light exposure amount and a focus value, and a combination of a light exposure amount and a focus value to be applied to an actual light exposure process is determined within this management span. With this arrangement, an etched pattern can be easily obtained within an admissible dimension range. Consequently, it is possible to decrease the number of defective products formed by the etching process.

In the example described above, a management span of combinations of a light exposure amount and a focus value is determined with reference only to the line widths of etched patterns. However, as described previously, where a scatterometory technique is used, not only the line width of an etched pattern, but also the bottom width and inclination can be obtained. Accordingly, a management span may be obtained by the following method. Specifically, at first, as described above, an initial management span is obtained with reference to the line widths of etched patterns. Then, the management span is narrowed with reference to the bottom widths. Then, the management span is further narrowed with reference to the pattern inclination values, thereby obtaining a final management span of combinations of a light exposure amount and a focus value.

Further, in the example described above, a management span of combinations of a light exposure amount and a focus value is determined by use of one test wafer W. Alternatively, two test wafers W may be used such that one of them is processed by Steps 1 to 5 and is then stored, while the other is processed by Steps 1 to 4 and Steps 7 to 11 (i.e., the shapes of resist patterns are not measured) and is then stored. In this case, the two test wafers W can be considered to have substantially the same shapes of resist patterns formed thereon. Where the test wafers W are stored, as described above, they can be used as references when re-conditioning of the wafer processing system is required.

Figure 8:
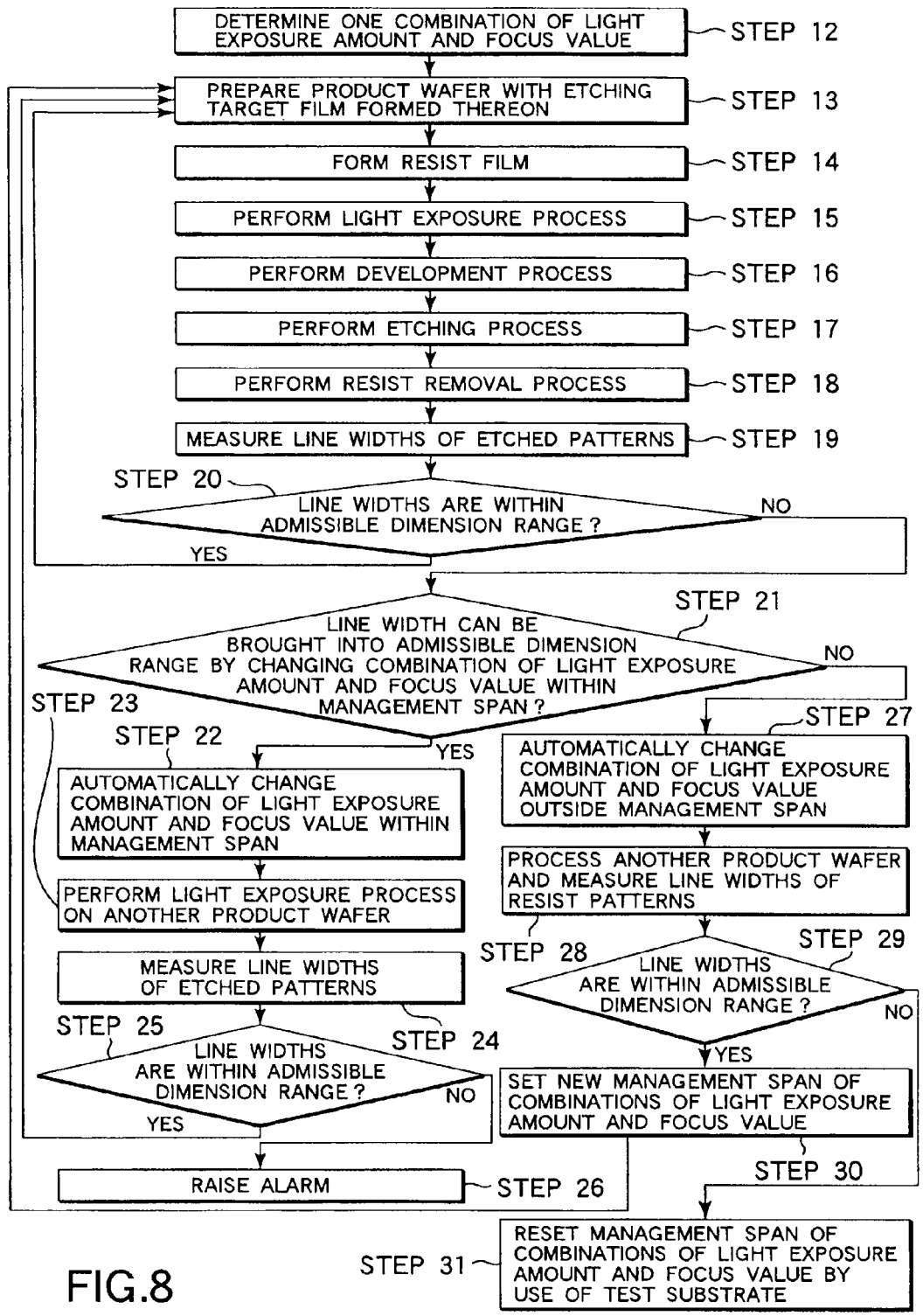
FIG. 8 This is a flowchart showing a method for changing combinations of a light exposure amount and a focus value.

Step 1 to 11 described above are performed before a process of product wafers is started. When a process of product wafers is actually performed after Step 11, the line width of a resist pattern may go out of an admissible dimension range, due to changes with time in the environment for manufacturing product wafers. These changes are caused by cleaning of the etching chamber, fluctuations in the nature of the etching target film, fluctuations in the nature of the resist film, a maintenance operation of the light exposure apparatus and resist coating/developing apparatus, and so forth. In order to solve this problem, adjustment of the light exposure amount and focus value may be required. A conditioning method performed for this purpose will be explained with reference to the flowchart shown in FIG. 8.

Figure 9:
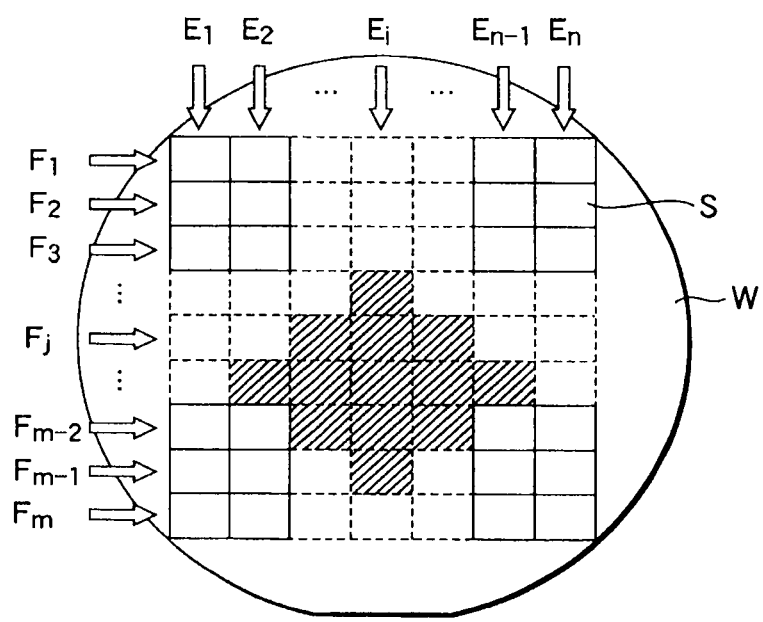
FIG. 9 This is a view showing the relationship of a matrix used for sequential light exposure, relative to a management span of combinations of a light exposure amount and a focus value.

After a management span of combinations of a light exposure amount and a focus value is determined by Step 11, a combination of conditions, i.e., a light exposure amount and a focus value, optimum to obtaining an etched pattern with a predetermined line width, is determined within this management span (Step 12). FIG. 9 shows a view in which a management span obtained by Step 11 is combined with the matrix shown in FIG. 4. In FIG. 9, a shaded region corresponds to the management span. For example, in Step 12, a combination of a light exposure amount and a focus value located essentially at the center of this management span may be used as initial set values for performing light exposure on product wafers W.

After a light exposure amount and a focus value are determined, as described above, a product wafer W with an etching target film formed thereon is prepared (Step 13), and a resist film is formed on the etching target film (Step 14). Then, the resist film is subjected to light exposure with a predetermined product pattern at the light exposure amount and focus value determined as described above, and then to development (Step 16). Then, while the resist patterns thus formed are used as an etching mask, the etching target film is etched to form etched patterns (Step 17). Then, the resist patterns are removed (Step 18). For every lot of product wafers W with etched patterns thus formed thereon or for a predetermined number of such product wafers W, the line widths of the formed etched patterns are measured by the second line width measuring unit (ODP-2) 17 (Step 19).

The line width of an etched pattern formed on product wafers W has on an admissible dimension range, as a matter of course. Accordingly, it is then judged whether or not the measured line widths are within an admissible range (Step 20). Where the line widths are within the admissible range, the flow returns to Step 13, and the process of product wafers W is continued. Where a line width is out of the admissible dimension range, the light exposure amount and focus value need to be changed by the integrated computer 11, so that the line widths of etched patterns to be formed on product wafers W are brought into the admissible dimension range.

For example, where the line width of an etched pattern is larger than the value of the admissible dimension range, it is estimated that the characteristic lines shown in FIG. 6 are shifted upward, in the case of data shown in FIG. 6, for example. In this case, by adjusting, e.g., the light exposure amount from the initial value $E_{i+1}$ to $E_i$ or $E_i-1$, or further to a lower value, the line width of the etched pattern can be brought into the admissible dimension range.

However, a combination of a light exposure amount and a focus value thus adjusted may be out of the management span obtained by Step 11. This combination is undesirable in light of the quality guarantee of product wafers W, because the light exposure process is unlikely to be suitably performed.

Accordingly, where a line width measured in Step 19 is out of the admissible dimension range, it is judged whether or not the line width of the etched pattern can be brought into the admissible dimension range by changing the combination of a light exposure amount and a focus value within the management span obtained by Step 11 (Step 21).

Where the line width of the etched pattern can be brought into the admissible dimension range by changing the combination of a light exposure amount and a focus value within the management span, the combination of a light exposure amount and a focus value is automatically changed to this combination by the integrated computer 11 (Step 22). This method is mainly applied to a case where the number of changing operations ever performed is still small, such as a case where the combination of a light exposure amount and a focus value is changed for the first time from the start of the process of product wafers W. It may be arranged such that the combination of a light exposure amount and a focus value can be manually changed by an operator (a new combination of a light exposure amount and a focus value is determined by the data I/O section 32).

After a new combination of a light exposure amount and a focus value is determined as described above, the light exposure process is performed by use of the new light exposure amount and focus value on a product wafer W subsequently processed in the light exposure apparatus 13, in accordance with an instruction from the integrated computer 11 (Step 23). Then, development, etching, and resist film removal are performed, and the line widths of etched patterns thereby formed on the product wafer W are measured (Step 24). Then, it is judged whether or not the line widths are within the admissible range (Step 25). Where the line widths thus measured are within the admissible dimension range, the flow returns to Step 13, and the process of product wafers W is continued. Where a line width thus measured is out of the admissible dimension range, the operation of the light exposure apparatus 13 is stopped and an alarm is raised both by the integrated computer 11 (Step 26). Where an alarm is raised, an examination of the etched patterns on the product wafer W and a check of the wafer processing system are performed by an operator, so that product wafers W can be processed.

On the other hand, as a result of judgment in Step 21, where the line width of an etched pattern cannot be brought into the admissible dimension range by changing the combination of a light exposure amount and a focus value within the management span, the light exposure apparatus 13 is once adjusted to use a new combination of a light exposure amount and a focus value outside the management span (Step 27).

Next, an explanation will be given as to why there is such a case where the line width of an etched pattern cannot be brought into an admissible dimension range by changing the combination of a light exposure amount and a focus value within the management span.

Specifically, as described above, where the line width of an etched pattern can be brought into the admissible dimension range by changing the combination of a light exposure amount and a focus value within the management span, the light exposure amount and focus value are adjusted in Step 22. With such adjustment, for example, the combination of a light exposure amount and a focus value is shifted from the center of the shaded region first set in FIG. 9 to an outer position within the shaded region. Where such a change is repeated several times, a new combination of a light exposure amount and a focus value may go out of the management span.

In this case, in Step 27, the light exposure apparatus 13 is once adjusted to use a new combination of a light exposure amount and a focus value outside the management span, so that the productivity rate is prevented from being deteriorated due to stoppage of the wafer processing system. This is so, because product wafers W may be sufficiently processed by use of a new combination of a light exposure amount and a focus value thus set.

After the light exposure apparatus 13 is adjusted to use the new light exposure amount and focus value thus set, the light exposure with the product pattern is performed under the new conditions on another product wafer W. Then, development is performed, and the shapes (line widths) of resist patterns thereby formed are checked (Step 28).

The line width of a resist pattern is required to be within a certain admissible dimension range, so that the line width of an etched pattern to be formed thereafter is brought into an admissible dimension range. Accordingly, it is judged whether or not the line widths of the resist patterns obtained by Step 28 are within the admissible dimension range (Step 29). Where they are within the admissible range, a new management span of combinations of a light exposure amount and a focus value is determined and reset, with reference to the shapes of resist patterns formed on the test substrate in advance, the target dimension of the test pattern, and the combinations of a light exposure amount and a focus value used in the reference light exposure (Step 30). Then, after a new combination of a light exposure amount and a focus value is determined, the flow returns to Step 13, and the process of product wafers W is continued.

On the other hand, where the line width of a resist pattern is out of the certain dimension range, the process of product wafers W is stopped. Then, by use of a new test substrate, the processes of from Step 1 to Step 11 are performed again, so that a new management span of combinations of a light exposure amount and a focus value is determined (Step 31). Thereafter, the process of from Step 12 can be restarted.

Where this process of Step 31 is performed, it is preferable to check in advance the apparatuses used for sequential processes from the etching target film formation through the resist film formation and the etching process to the resist film removal. In this case, the time period to the next check of the system can be prolonged, while fluctuations of process conditions during this time period is suppressed, so the quality of product wafers W can be easily maintained at a certain level.

Figure 10:
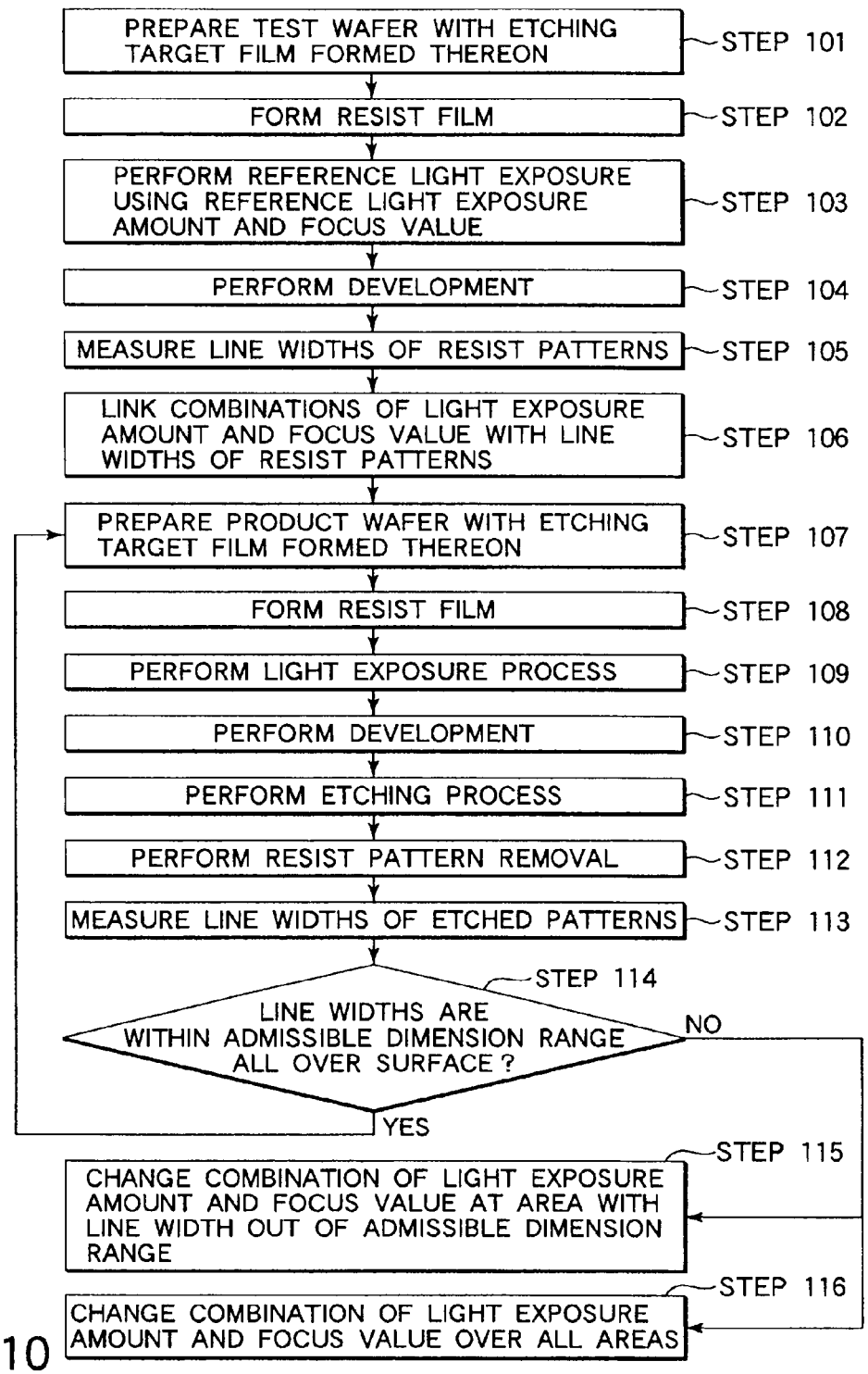
FIG. 10 This is a flowchart showing a method for conditioning the wafer processing system to decrease generation of planar fluctuations of etched patterns.

Next, an explanation will be given of a method for adjusting the light exposure apparatus 13, where products are manufactured in the wafer processing system, with reference to the flowchart shown in FIG. 10. This method is intended to suppress planar fluctuations of the shapes obtained by an etching process on a wafer W, so as to obtain etched patterns with a predetermined shape for all the shots on the surface of the wafer W.

Figure 3:
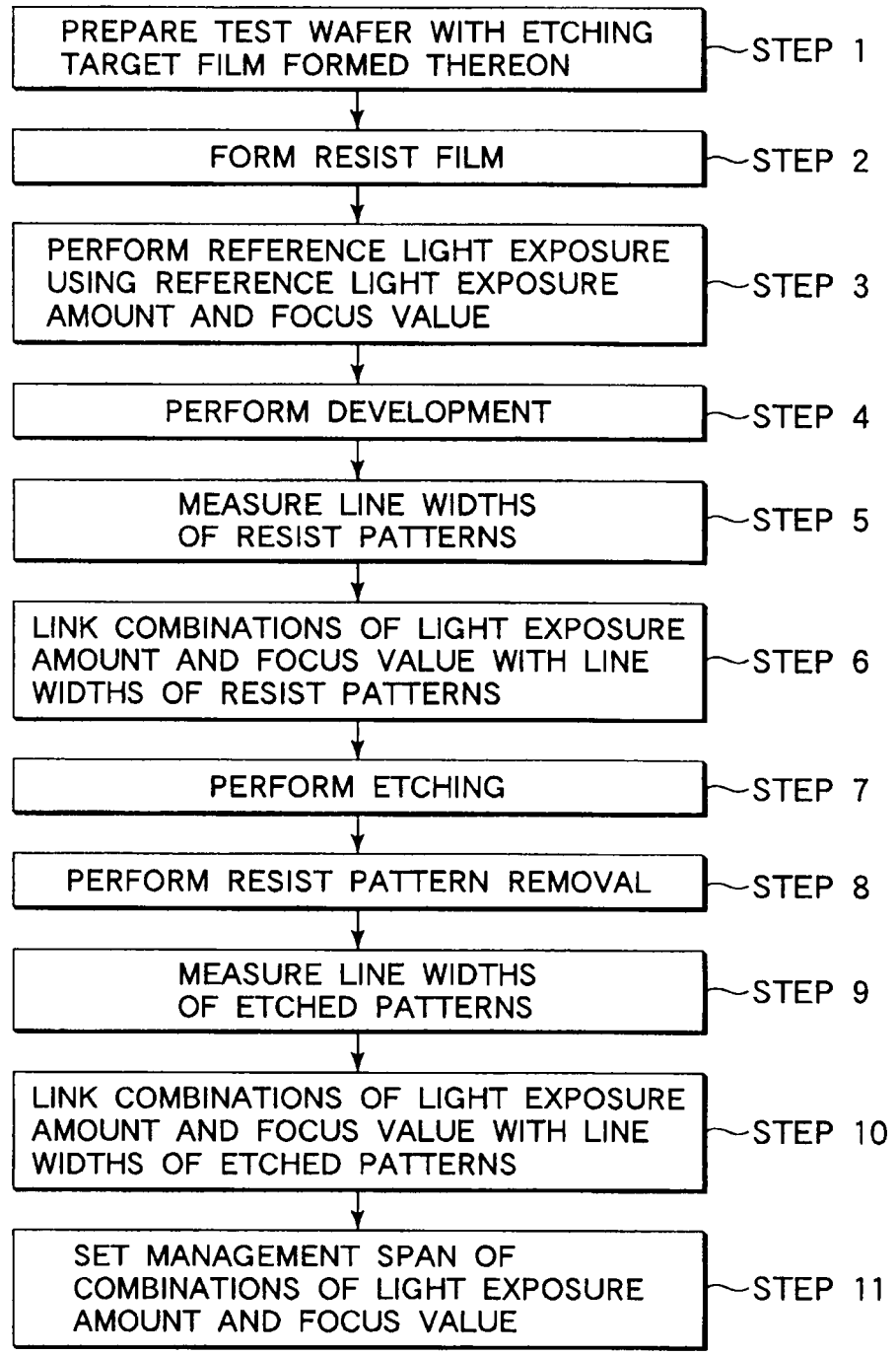
FIG. 3 This is a flowchart showing a method for conditioning the wafer processing system.

At first, a test wafer is processed by use of the same operations as Steps 1 to 6 shown in FIG. 3 described above. Specifically, an etching target film is formed (Step 101), and a resist film is formed (Step 102). Then, reference light exposure is performed thereon by use of a photo-mask having a test pattern (Step 103), and is followed by a development process (Step 104). Then, the shapes of resist patterns thereby formed are measured by means of a scatterometry technique (Step 105). Then, the combinations of a light exposure amount and a focus value used in the reference light exposure are linked with data concerning the shapes of the resist patterns (Step 106).

Subsequently, a product wafer W with an etching target film formed thereon is prepared (Step 107), and a resist film is formed (Step 108). Then, light exposure is performed thereon by use of a photo-mask having a pattern for manufacturing products, along with a combination of a light exposure amount and a focus value empirically known as providing no defective products (Step 109), and is followed by a development process (Step 110). Then, resist patterns thereby formed are used as an etching mask to perform etching (Step 111), and are then removed by a removing process (Step 112). Then, the shapes of etched patterns thereby formed are measured by means of a scatterometry technique (Step 113).

Then, it is judged whether or not the line widths of the etched patterns measured by Step 113 are within an admissible range all over the surface of the product wafer W (Step 114). Where the line widths are within the admissible range all over the surface of the product wafer W, the flow returns to Step 107, and the process of product wafers W is continued.

In this respect, there may be a case where the line width of an etched pattern measured by Step 113 is within the admissible range on a part of the product wafer W while the line width of an etched pattern is out of the admissible range on another part of the product wafer W. For example, it is empirically known that plasma etching processes tend to result in line widths smaller at the central portion of a wafer W than at the peripheral portion. In other words, the line widths of etched patterns render a doughnut-like distribution. Accordingly, there is a case where the line widths are within the admissible range only on a part of the surface, e.g., the line width of an etched pattern is within the admissible range at the central portion of the product wafer W while the line width of an etched pattern is out of the admissible range at the peripheral portion. In this case, according to a first method, the light exposure amount and focus value are adjusted at the peripheral portion of the product wafer W (Step 115). Further, according to a second method, the light exposure amount and focus value are adjusted all over the product wafer W (Step 116). However, the second method is usable on the condition that, where the light exposure amount and focus value are adjusted all over the product wafer W in accordance with adjustment in the light exposure amount and focus value at the peripheral portion of the product wafer W, the line width still stays within the admissible range at the central portion of the product wafer W. By use of either one of the methods described above, the line widths of the etched patterns are brought into the admissible range all over the product wafer W.

In order to perform such adjustment in the light exposure amount and focus value, the examination result of the test wafer W described above is utilized. For example, in the state described above, the line width of an etched pattern is within the admissible range at the central portion of the product wafer W while the line width of an etched pattern is out of the admissible range at the peripheral portion. In this case, since the line width is larger than a predetermined line width at the peripheral portion of the product wafer W, the first method is applied, as follows. Specifically, the test wafer W includes an area processed by light exposure with the same light exposure amount and focus value as the preceding light exposure amount and focus value used for the product wafer W. At first, a search is made for this light exposure area (shot) to select a light exposure amount and a focus value that provide a line width smaller than the line width of the resist pattern of this area. Then, when the light exposure is performed on a product wafer W, the preceding light exposure amount and focus value are used for the light exposure at the central portion of the product wafer W, while the new light exposure amount and focus value are used for the light exposure at the peripheral portion. Consequently, the line widths of the resist patterns can be brought into the admissible range all over the product wafer W.

In this first method, the light exposure amount and focus value may be adjusted for every light exposure shot. In this case, the planar uniformity in the line widths of the etched patterns can be more improved all over the product wafer W.

On the other hand, where the second method is applied, the following operations are used. Specifically, as described above, the test wafer W includes an area processed by light exposure with the same light exposure amount and focus value as the preceding light exposure amount and focus value used for the product wafer W. At first, a search is made for this light exposure area (shot) to select a combination of a light exposure amount and a focus value that provide a line width smaller than the line width of the resist pattern of this area. In this case, the combination of a light exposure amount and a focus value selected at this time is further conditioned such that, where the combination is used for the light exposure at the central portion of the product wafer W, the line width of an etched pattern thereby obtained still stays within the admissible range. Then, when light exposure is performed on a product wafer W, only the new light exposure amount and focus value thus selected are used for the light exposure of the product wafer W. Also with this method, the line widths of the resist patterns can be brought into the admissible range all over the product wafer W. This second method is mainly applied to a case where the difference in the line widths of the resist patterns is small between light exposure shots.

In either of the first and second methods, adjustment of the light exposure amount and focus value is performed in accordance with an operator's judgment and/or coefficient models designed by operators or engineers.

The embodiment described above is intended only to clarify the technical content of the present invention, and, therefore, the present invention should not be construed as being limited to the embodiment. Various modifications may be made without departing from the spirit of the present invention or the scope of the appended claims.

For example, in place of a single etching apparatus, a plurality of etching apparatuses may be used, or an etching apparatus including a plurality of etching chambers may be used. Similarly, in place of a single resist coating/developing apparatus, a plurality of resist coating/developing apparatuses may be used, or a plurality of resist coating units and a plurality of development units may be used. In this case, individual differences may be present between etching apparatuses or etching chambers, or between resist coating/developing apparatuses, resist coating units, or development units, and bring about fluctuations of process conditions undetectable under operational conditions normally set in the apparatuses. In this case, it is preferable to provide all the processing portions with respective IDs, and to arrange the integrated computer as follows. Specifically, management spans corresponding to photolithography process conditions are respectively set for combinations of all the IDs, and the combination of a light exposure amount and a focus value can be changed for every management span to obtain an etched pattern with a predetermined shape.

Further, where data concerning such changes are accumulated and utilized, it is possible to improve the timing and accuracy of changes in the combination of a light exposure amount and a focus value.

In the embodiment described above, the present invention is applied to a semiconductor wafer. Alternatively, the present invention may be applied to another substrate, such as glass substrate used for an FPD (flat panel display device), a representative of which is a liquid crystal display device.

INDUSTRIAL APPLICABILITY

The present invention can be preferably utilized for a case where high accuracy in line width is required in manufacturing semiconductor devices or FPDs.

The invention claimed is:
1. A substrate processing apparatus comprising:
a light exposure processing section configured to perform light exposure with a predetermined pattern on a resist film formed on an etching target layer disposed on a substrate;
a pattern shape measuring section configured to measure a shape of a resist pattern and a shape of an etched pattern by means of a scatterometory technique; and
a control section configured to control operations of the apparatus including those of the light exposure processing section and the pattern shape measuring section, the control section including a computer and a non-transitory storage portion storing a program to be executed on the computer,
wherein the program, when executed, causes the computer to control the substrate processing apparatus to conduct a sequence for setting a light exposure condition, the sequence comprising:
forming a test resist film on a test etching target layer disposed on a test substrate, and performing sequential light exposure with a predetermined test pattern on the test resist film sequentially at a plurality of areas, while respectively using different combinations of a light exposure amount and a focus value, along with subsequent development, thereby forming test resist patterns at the plurality of areas;
measuring shapes of the test resist patterns at the plurality of areas by means of a scatterometry technique;
etching the test etching target layer by use of the test resist film with the test resist patterns formed thereon as an etching mask, and removing the test resist film from the test substrate, thereby forming test etched patterns at the plurality of areas;
measuring shapes of the test etched patterns at the plurality of areas by means of a scatterometry technique; and
determining a management span of combinations of a light exposure amount and a focus value for performing light exposure on a resist film on a product substrate, admissible to obtain an etched pattern with a predetermined shape, with reference to the combinations of a light exposure amount and a focus value used in the sequential light exposure for the plurality of areas, measurement results of the shapes of the test resist patterns formed at the plurality of areas, and measurement results of the shapes of the test etched patterns formed at the plurality of areas, wherein said forming test resist patterns comprises arranging the plurality of areas in a matrix format, and performing a light exposure process respectively on the plurality of areas, each by one shot, while sequentially changing the light exposure amount at intervals within a range of from $E_1$ to $E_n$ (n is natural number) and sequentially changing the focus value at intervals within a range of from $F_1$ to $F_m$ (m is natural number), respectively for the plurality of areas, and said determining a management span comprises selecting areas within the plurality of areas arranged in the matrix format to define the management span.

2. The substrate processing apparatus according to claim 1, wherein the sequence further comprises:

determining one combination of a light exposure amount and a focus value within the management span after determining the management span;

forming a first resist film on a first etching target layer disposed on a first product substrate, and performing light exposure with a predetermined product pattern on the first resist film, while using the combination of a light exposure amount and a focus value thus determined, along with subsequent development, thereby forming a first resist pattern;

etching the first etching target layer by use of the first resist film with the first resist pattern formed thereon as an etching mask, and removing the first resist film, thereby forming a first etched pattern;

measuring a shape of the first etched pattern by means of a scatterometry technique;

judging whether or not the shape of the first etched pattern is within a predetermined admissible dimension range; and, if the shape of the first etched pattern is out of the predetermined admissible dimension range, determining a new combination of a light exposure amount and a focus value for performing light exposure on a second resist film on a second product substrate within the management span such that a shape of a second etched pattern to be formed on the second product substrate subsequently processed by the predetermined product pattern is brought into the predetermined admissible dimension range.

3. The substrate processing apparatus according to claim 1, wherein the sequence further comprises:

determining one combination of a light exposure amount and a focus value within the management span after determining the management span;

forming a first resist film on a first etching target layer disposed on a first product substrate, and performing light exposure with a predetermined product pattern on the first resist film, while using the combination of a light exposure amount and a focus value thus determined, along with subsequent development, thereby forming a first resist pattern;

etching the first etching target layer by use of the first resist film with the first resist pattern formed thereon as an etching mask, and removing the first resist film, thereby forming a first etched pattern;

measuring a shape of the first etched pattern by means of a scatterometry technique;

judging whether or not the shape of the first etched pattern is within a predetermined admissible dimension range;

if the shape of the first etched pattern is out of the predetermined admissible dimension range, and a new combination of a light exposure amount and a focus value, determined such that a shape of a second etched pattern to be formed on a second product substrate subsequently processed by the predetermined product pattern is brought into the predetermined admissible dimension range, is out of the management span, performing light exposure with the predetermined product pattern on a second resist film on the second product substrate, while using the new combination of a light exposure amount and a focus value thus determined, along with subsequent development, thereby forming a second resist pattern;

measuring a shape of the second resist pattern by means of a scatterometry technique;

judging whether or not the shape of the second resist pattern is within a certain admissible dimension range;

if the shape of the second resist pattern is within the certain admissible dimension range, determining a new management span of combinations of a light exposure amount and a focus value, with reference to a target dimension of the test pattern, the shapes of the test resist patterns, and the combinations of a light exposure amount and a focus value used in the sequential light exposure; and, if the shape of the second resist pattern is out of the certain admissible dimension range, re-executing a series of processes to determine a new management span of combinations of a light exposure amount and a focus value, while using a new test substrate.

4. The substrate processing apparatus according to claim 1, wherein said $E_1$ to $E_n$ are set by sequentially changing the light exposure amount at regular intervals and said $F_1$ to $F_m$ are set by sequentially changing the focus value at regular intervals.

5. The substrate processing apparatus according to claim 1, wherein a measurement target of each of the test resist pattern and the test etched pattern includes a line width of the pattern.

6. The substrate processing apparatus according to claim 1, wherein the pattern shape measuring section includes a first measuring section configured to measure a shape of a resist pattern and a second measuring section configured to measure a shape of an etched pattern.

7. A substrate processing apparatus comprising:

a light exposure processing section configured to perform light exposure with a predetermined pattern on a resist film formed on an etching target layer disposed on a substrate;

a pattern shape measuring section configured to measure a shape of a resist pattern and a shape of an etched pattern by means of a scatterometry technique: and a control section configured to control operations of the apparatus including those of the light exposure processing section and the pattern shape measuring section, the control section including a computer and a non-transitory storage portion storing a program to be executed on the computer, wherein the program, when executed, causes the computer to control the substrate processing apparatus to conduct a sequence for setting a light exposure condition, the sequence comprising:

forming a test resist film on a test etching target layer disposed on a test substrate, and performing sequential light exposure with a predetermined test pattern on the test resist film sequentially at a plurality of areas, while respectively using different combinations of a light exposure amount and a focus value, along with subsequent development, thereby forming test resist patterns at the plurality of areas;

measuring shapes of the test resist patterns at the plurality of areas by means of a scatterometry technique;

linking the combinations of a light exposure amount and a focus value used in the sequential light exposure for the plurality of areas with measurement results of the shapes of the test resist patterns formed at the plurality of areas;

forming a first resist film on a first etching target layer disposed on a first product substrate, and performing light exposure with a predetermined product pattern on the first resist film, while using an initial combination of a light exposure amount and a focus value, along with subsequent development, thereby forming a first resist pattern;

etching the first etching target layer by use of the first resist film with the first resist pattern formed thereon as an etching mask, and removing the first resist film, thereby forming first etched patterns;

measuring shapes of the first etched patterns by means of a scatterometry technique;

judging whether or not the shapes of the first etched patterns are within a predetermined admissible dimension range; and, if the first etched patterns include an etched pattern at an area with a shape out of the predetermined admissible dimension range, changing the initial combination to a different combination of a light exposure amount and a focus value for performing light exposure on a second resist film on a second product substrate, such that shapes of all second etched patterns on the second product substrate subsequently processed by the predetermined product pattern are brought into the predetermined admissible dimension range, with reference to the combinations of a light exposure amount and a focus value used in the sequential light exposure for the plurality of areas on the test substrate and measurement data of the shapes of the test resist patterns, wherein said forming test resist patterns comprises arranging the plurality of areas in a matrix format, and performing a light exposure process respectively on the plurality of areas, each by one shot, while sequentially changing the light exposure amount at intervals within a range of from $E_1$ to $E_n$ (n is natural number) and sequentially changing the focus value at intervals within a range of from $F_1$ to $F_m$ (m is natural number), respectively for the plurality of areas.

8. The substrate processing apparatus according to claim 7, wherein the sequence comprises performing said changing the initial combination by applying a new combination of a light exposure amount and a focus value to the second resist film at an area with a shape of the first etched pattern out of the predetermined admissible dimension range, and applying a preceding combination of a light exposure amount and a focus value to the second resist film at an area with a shape of the first etched pattern within the predetermined admissible dimension range.

9. The substrate processing apparatus according to claim 7, wherein said $E_1$ to $E_n$ are set by sequentially changing the light exposure amount at regular intervals and said $F_1$ to $F_m$ are set by sequentially changing the focus value at regular intervals.

10. The substrate processing apparatus according to claim 7, wherein a measurement target of each of the test resist pattern and the first etched pattern includes a line width of the pattern.

11. The substrate processing apparatus according to claim 7, wherein the pattern shape measuring section includes a first measuring section configured to measure a shape of a resist pattern and a second measuring section configured to measure a shape of an etched pattern.

\* \* \* \* \*